US012593426B2

(12) United States Patent
Chigullapalli et al.

(10) Patent No.: US 12,593,426 B2
(45) Date of Patent: Mar. 31, 2026

(54) FLUID CONTROL APPARATUS FOR AIR VENTS IN RACK ASSEMBLY

(71) Applicant: AMD Design, LLC, Wilmington, DE (US)

(72) Inventors: Sruti Chigullapalli, Seattle, WA (US); Paul Anderson, Leander, TX (US)

(73) Assignee: AMD Design, LLC, Wilmington, DE (US)

( * ) Notice: Subject to any disclaimer, the term of this patent is extended or adjusted under 35 U.S.C. 154(b) by 301 days.

(21) Appl. No.: 18/447,251

(22) Filed: Aug. 9, 2023

(65) Prior Publication Data

US 2025/0056770 A1     Feb. 13, 2025

(51) Int. Cl.
*H05K 7/20*          (2006.01)

(52) U.S. Cl.
CPC ..... *H05K 7/20781* (2013.01); *H05K 7/20836* (2013.01)

(58) Field of Classification Search
CPC ...................... H05K 7/20781; H05K 7/20836
USPC ...................................... 361/679.53
See application file for complete search history.

(56) References Cited

U.S. PATENT DOCUMENTS

| | | | | |
|---|---|---|---|---|
| 4,682,993 | A | * | 7/1987 | Todd ...................... B01D 46/10 55/506 |
| 4,842,443 | A | * | 6/1989 | Argandona .............. B67D 7/06 141/86 |

| | | | | |
|---|---|---|---|---|
| 5,058,633 | A | * | 10/1991 | Sharp ................... B65D 90/105 220/86.1 |
| 6,216,489 | B1 | * | 4/2001 | Potnis ....................... F28B 1/02 165/909 |
| 8,322,155 | B2 | * | 12/2012 | Tutunoglu ............... F25B 1/00 62/197 |
| 8,611,083 | B2 | * | 12/2013 | Kumlin ..................... G06F 1/20 361/699 |
| 8,684,024 | B2 | * | 4/2014 | Kuehn ................. B65D 90/105 141/86 |
| 10,416,736 | B2 | * | 9/2019 | Dupont ............. H05K 7/20936 |
| 10,952,353 | B1 | * | 3/2021 | Bean, Jr. ............ H05K 7/20836 |
| 11,744,043 | B2 | * | 8/2023 | Gao ...................... H05K 7/203 361/679.53 |
| 11,985,791 | B1 | * | 5/2024 | Kom ................... H05K 7/20836 |
| 12,189,441 | B2 | * | 1/2025 | Ramakrishnan ...... H01L 23/481 |
| 2009/0270024 | A1 | * | 10/2009 | Buck ..................... F24F 13/082 209/280 |
| 2011/0026225 | A1 | * | 2/2011 | Ostwald ............. H05K 7/20645 165/104.31 |
| 2017/0184529 | A1 | * | 6/2017 | LaRocque ................. F17D 3/01 |
| 2017/0356646 | A1 | * | 12/2017 | Leung ..................... F23J 13/04 |

* cited by examiner

*Primary Examiner* — Anatoly Vortman
(74) *Attorney, Agent, or Firm* — SCULLY, SCOTT, MURPHY & PRESSER, P.C.

(57)          ABSTRACT

A fluid control apparatus can include a housing and a drainage hose. The housing can form a chamber operable to receive at least one air vent for a cooling system such that the housing surrounds the air vent and prevents fluid exiting the air vent from passing through the housing. The drainage hose can be fluidly coupled with the housing. The drainage hose can be operable to drain fluid from the chamber of the housing to a drainage tray.

18 Claims, 8 Drawing Sheets

FLUID CONTROL APPARATUS FOR AIR VENTS IN RACK ASSEMBLY

FIELD

The present disclosure relates generally to a fluid control apparatus operable to restrict coolant fluid from being dispersed throughout a rack assembly.

BACKGROUND

Cooling systems can be utilized control the temperature of the computing systems received in rack assemblies. During initial filling of the cooling system, coolant and/or air can exit air vents of the cooling system and spray and/or splatter, for example on electrical components, servers, power distribution units, rack, and/or floor.

BRIEF DESCRIPTION OF THE DRAWINGS

Implementations of the present technology will now be described, by way of example only, with reference to the attached figures, wherein.

DETAILED DESCRIPTION

Figure 1:
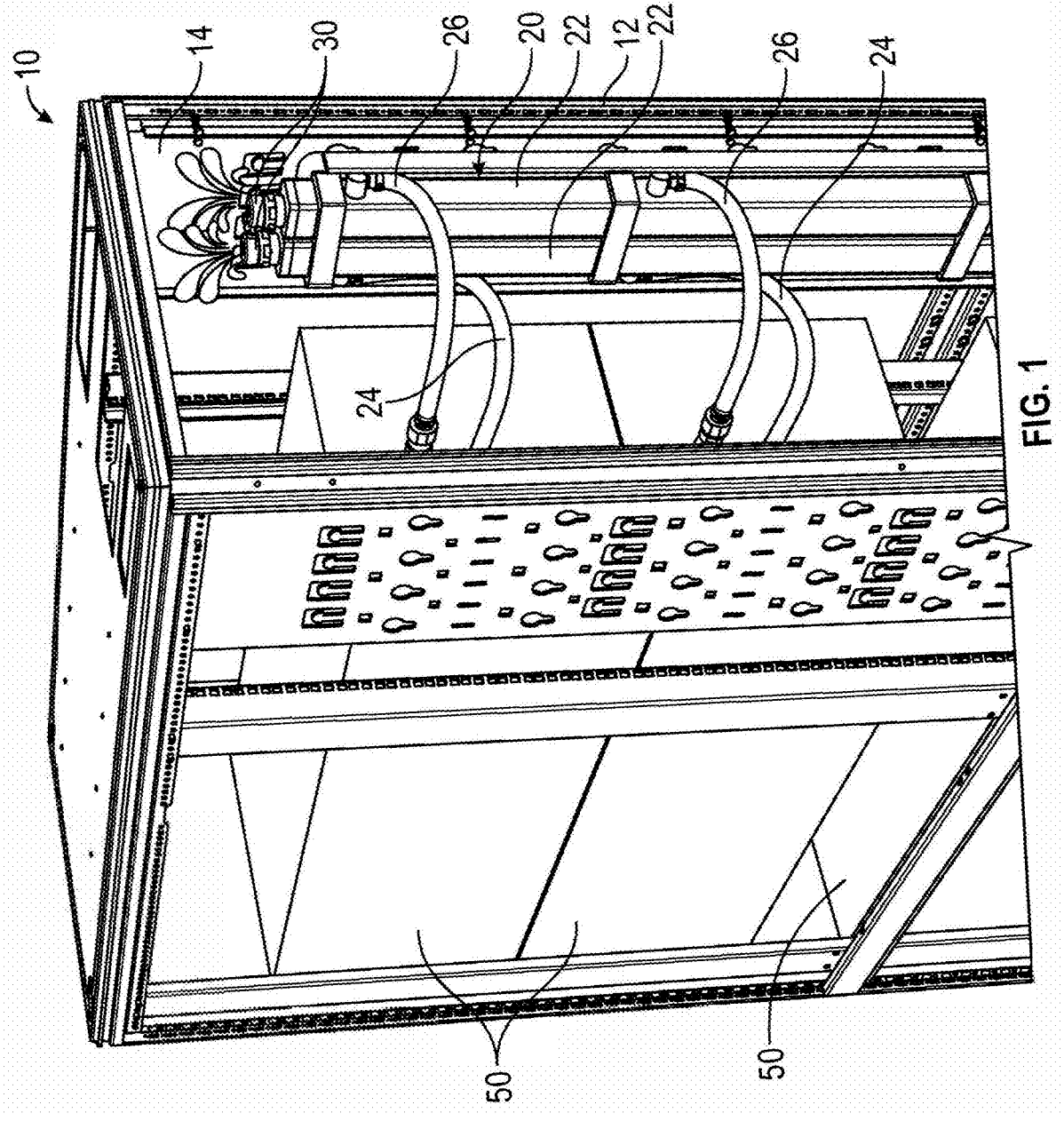
FIG. 1 illustrates a rack assembly with a plurality of computing systems and a cooling system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term "coupled" is defined as connected, whether directly or indirectly through intervening components, and is not necessarily limited to physical connections. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" means reasonably close to the particular value. For example, about does not require the exact measurement specified and can be reasonably close. As used herein, the word "about" can include the exact number. The term "near" as used herein is within a short distance from the particular mentioned object. The term "near" can include abutting as well as relatively small distance beyond abutting. The terms "comprising," "including" and "having" are used interchangeably in this disclosure. The terms "comprising," "including" and "having" mean to include, but not necessarily be limited to the things so described.

FIG. 1 illustrates a rack assembly 10 that includes a rack 12 that is operable to receive one or more computing systems 50. The computing systems 50 can be coupled with the rack 12. In some examples, the computing systems 50 can be received on one or more rails and/or shelves of the rack 12.

The rack assembly 10 can include a cooling system 20 operable to provide fluid (for example coolant) to the computing system(s) 50 to manage the temperature of the computing system(s) 50. In at least one example, the cooling system 20 can include one or more fluid columns 22 operable to receive the fluid. In some examples, as illustrated in FIG. 1, the cooling system 20 (e.g., the fluid columns 22) can be coupled with the rack 12. As the fluid flows through the fluid columns 22 of the cooling system 20 and the computing systems 50, the fluid is operable to extract heat from the computing system 50 and then release the heat in the cooling system 20. For example, the cooling system 20 can include an input conduit 24 operable to provide the fluid at a lower temperature from a fluid column 22 to the corresponding computing system 50. The fluid is heated as the fluid pulls heat from the components of the computing system 50. The heated fluid then flows back to a fluid column 22 of the cooling system 20 via an outlet conduit 26. In the cooling system 20, the fluid can then be cooled down to be reused.

The cooling system 20 can include at least one air vent 30. The air vent 30 can allow air to be released from the cooling system 20 (e.g., the fluid columns 22) to release pressure. In at least one example, as illustrated in FIG. 1, the cooling system 20 can include two air vents 30, with one air vent 30 corresponding with a fluid column 22. In other examples, one, three, or more air vents 30 can be included without deviating from the scope of the disclosure. The air vents 30 can be disposed on top of the fluid columns 22 and received in the rack 12.

During initial filling of the cooling system 20 with the fluid, a mixture of the fluid and air can exit the air vents 30. When the fluid exits the air vents 30, the fluid can spray and/or splatter on the rack assembly 10, for example computing systems 50, electrical components, power distribution units, rack 12, and/or the floor. In at least one example, the fluid can exit the air vents 30 during normal powered-on operation of the computing systems 50. The fluid can damage the rack assembly 10 (e.g., rack 12 and/or the computing systems 50), and also risk the safety of users (for example slipping on the floor).

Figure 2A:
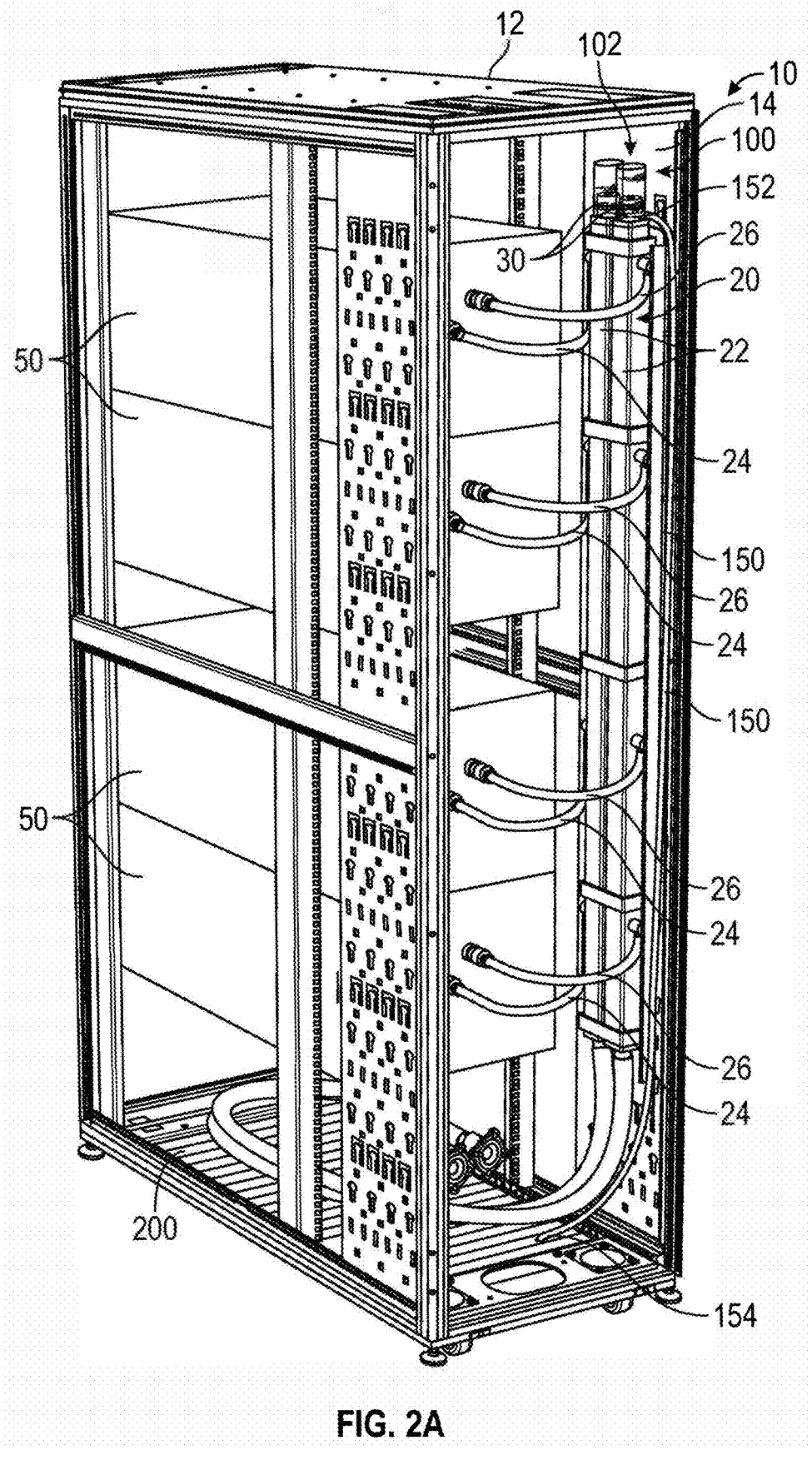
FIG. 2A illustrates the rack assembly with a fluid control apparatus.
Figure 2B:
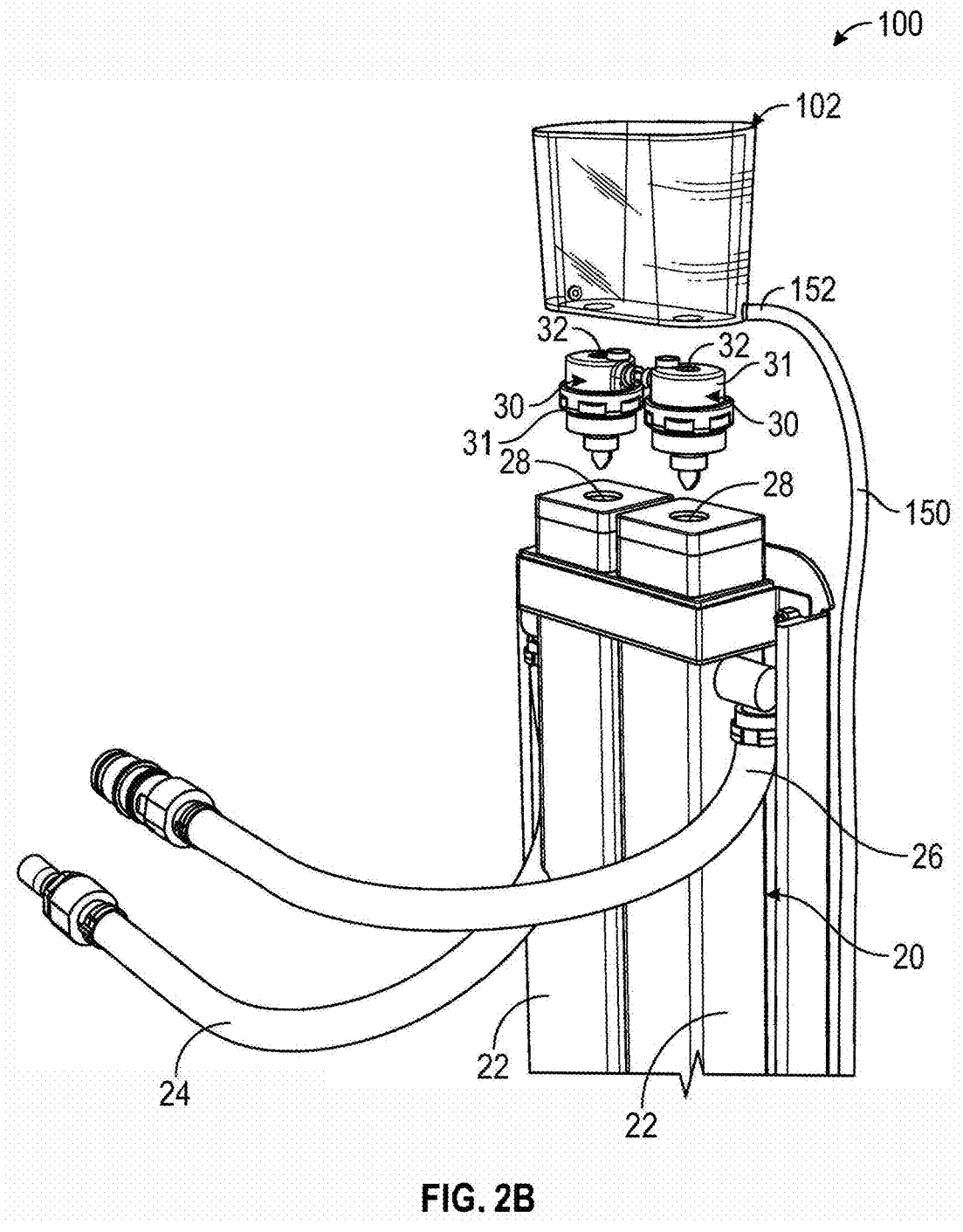
FIG. 2B illustrates an enlarged view of a portion of the rack assembly with the fluid control apparatus and the cooling system.

FIGS. 2A and 2B illustrate a fluid control apparatus 100 that is operable to prevent the fluid exiting the air vents 30 from being dispersed throughout the rack assembly 10. The fluid control apparatus 100 can include a housing 102 that can be operable to receive at least one of the air vents 30 for the cooling system 20 such that the fluid control apparatus 100 surrounds the air vents 30 and prevents fluid exiting the air vents 30 from passing through the housing 102 to disperse throughout the rack assembly 10. The housing 102 can be operable to be positioned on the cooling system 20.

In at least one example, the air vents 30 can include a vent housing 31 that is operable to be at least partially received in an annulus 28 of the fluid columns 22 of the cooling system 20. Accordingly, the air vents 30 can be in fluid communication with the fluid in the fluid columns 22. The air vents 30 can include a vent valve 32 that is in fluid communication with the fluid columns 22. The vent valve 32 can permit gas and/or fluid to pass from the fluid columns 22 through the vent housing 31 and exit through the vent valve 32.

The fluid control apparatus 100 can receive the air vents 30 such that the vent housing 31 is fully received within the housing 102 of the fluid control apparatus 100. For example, referring to FIGS. 2B-4, the housing 102 can form a chamber 120 operable to receive the air vents 30 and prevent fluid exiting the air vents 30 from passing through the housing 102.

The fluid control apparatus 100 can be operable to incorporate the air vents 30 into a sealed assembly. Accordingly, the housing 102 can form a seal around the air vents 30 to prevent fluid from passing therethrough.

In at least one example, a drainage hose 150 can be fluidly coupled with the housing 102. The drainage hose 150 can be operable to drain the fluid from the chamber 120 of the housing 102 to a drainage tray 200. For example, the drainage hose 150 can have an entry 152 and an exit 154. The entry 152 can be in fluid communication with the chamber 120 of the housing 102 so that fluid in the housing 102 can flow into the drainage hose 150. The exit 154 can be positioned so that the fluid exiting the drainage hose 150 via the exit 154 is deposited into the drainage tray 200. Accordingly, the housing 102 does not become filled with the fluid which can negatively impact the ability of the air vents 30 to vent air from the cooling system 20.

The housing 102 can include a bottom gasket 110 operable to receive the air vents 30 and prevent fluid from leaking therefrom. Accordingly, the bottom gasket 110 can prevent fluid from leaking from a bottom of the housing 102. In at least one example, the bottom gasket 110 can be operable to be positioned on the cooling system 20.

In some examples, the bottom gasket 110 can form one or more openings 112 operable to permit the vent housing 31 of the air vent 30 to pass through so that the air vent 30 can remain in fluid communication with the fluid columns 22. For example, the bottom gasket 110 can form two openings 112 when housing 102 of the fluid control apparatus 100 is operable to receive two air vents 30, as shown in FIGS. 2A-4. The number of openings 112 correspond with the number of air vents 30 that the housing 30 is operable to receive. With the bottom gasket 110, the housing 102 can form a localized reservoir to hold excess fluid. The excess fluid can then be removed from the housing 102 via the drainage hose 150 to a desired location such as the drainage tray 200.

In at least one example, at least a portion of the housing 102 includes a porous membrane 156. The porous membrane 156 can be operable to permit air to pass therethrough and prevent fluid from passing therethrough. Accordingly, the housing 102 can be operable to prevent fluid from passing therethrough to keep the fluid away from the rack assembly 10 while permitting air from the air vent(s) 30 to pass therethrough to release pressure. In a least one example, the porous membrane 156 can include a hydrophobic mesh. In some examples, the porous membrane 156 can include cellulose acetate, cellulose nitrate (collodion), polyamide (nylon), polycarbonate, polypropylene, and/or polytetrafluoroethylene (PTFE). In some examples, the porous membrane 156 can include an oleophobic membrane. An oleophobic membrane can be a membrane that resists capillary flow wetting by oils and other low surface tension fluids including water and PG25. Accordingly, the oleophobic membrane can repel oils and other low surface tension fluids including water and PG25.

Figures 3A, 3B:
FIG. 3A illustrates the fluid control apparatus.
FIG. 3B illustrates a cross-sectional view of the fluid control apparatus.
Figure 3C:
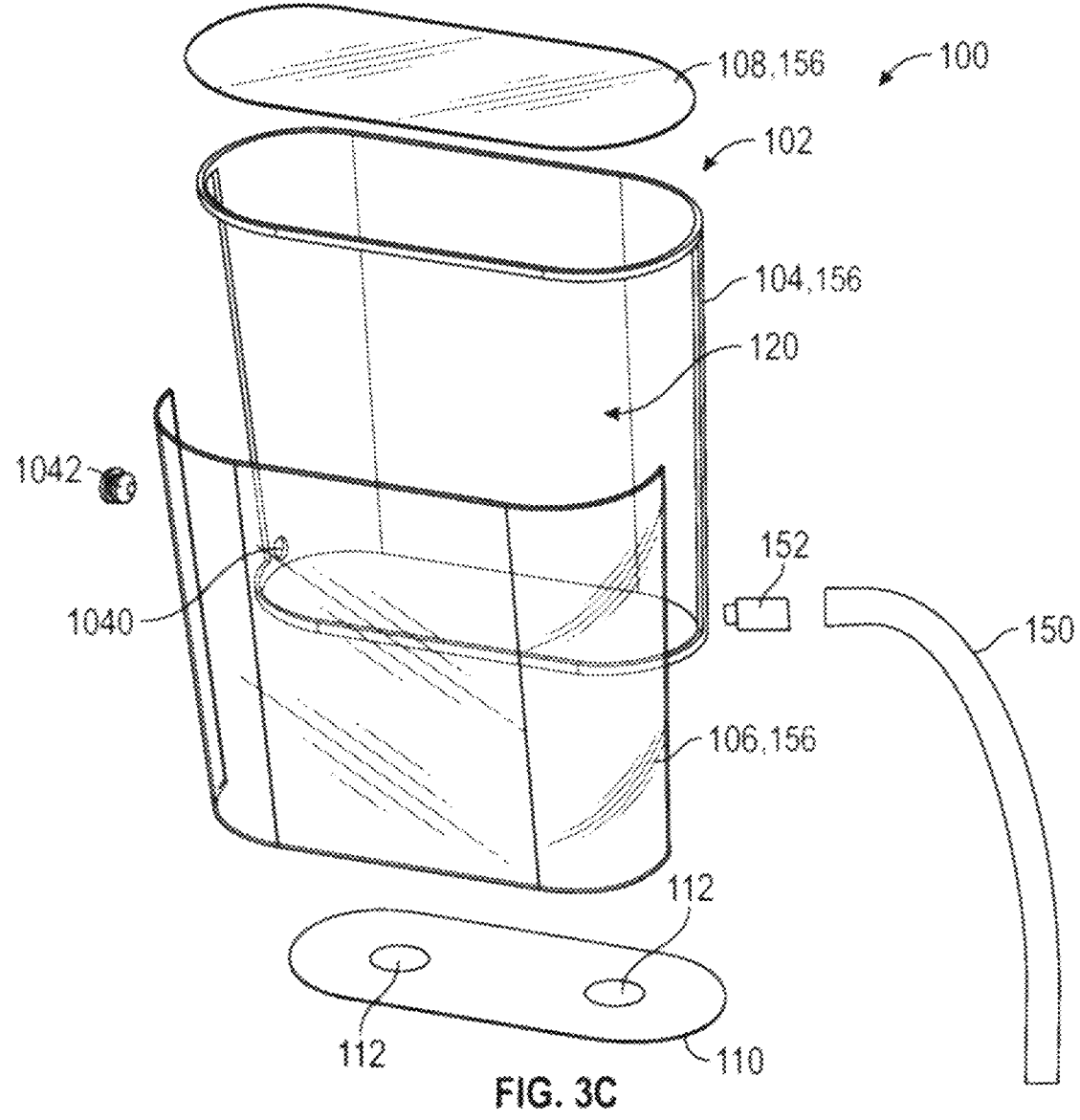
FIG. 3C illustrates an exploded view of the fluid control apparatus.
Figure 4:
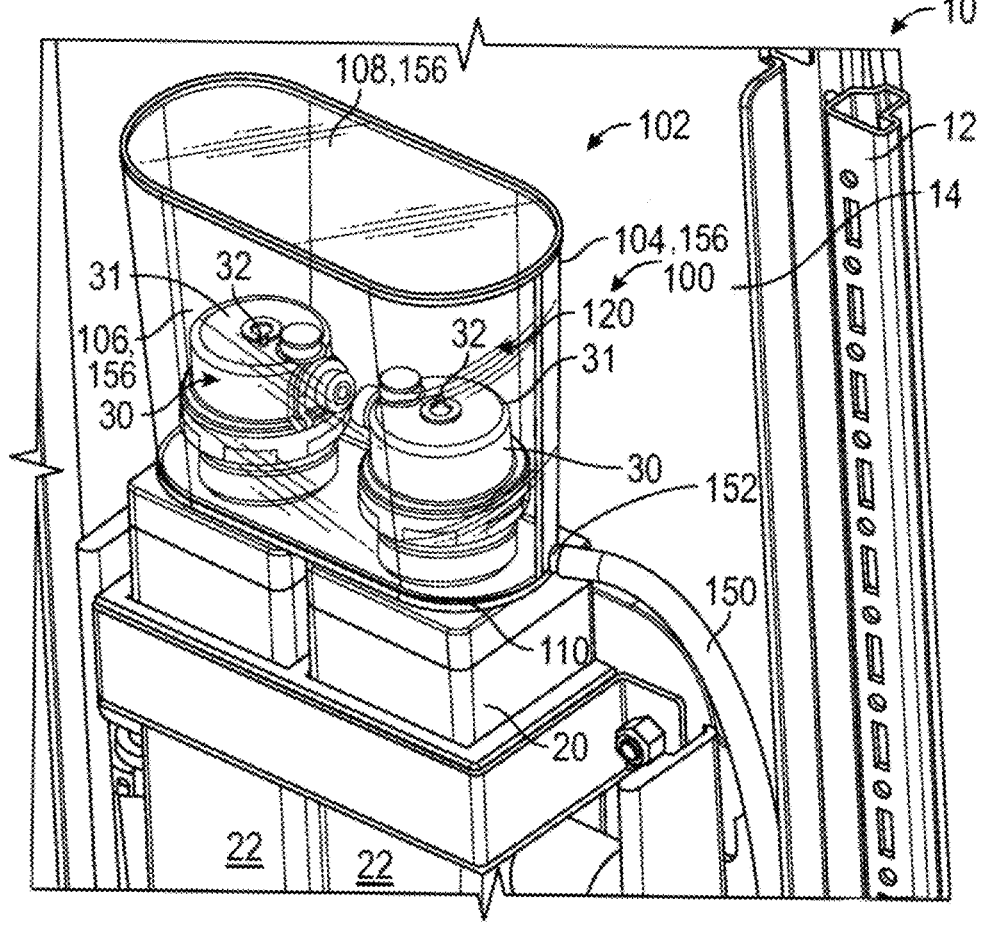
FIG. 4 illustrates the fluid control apparatus on the cooling system.

In at least one example, as illustrated in FIG. 3C, the housing 102 can include a main portion 104, a mesh portion 106, a top cover 108, and/or a bottom gasket 110. The main portion 104 can be coupled with the mesh portion 106. In some examples, the main portion 104 can be coupled with the mesh portion 106 in a clamshell fashion. In some examples, the mesh portion 106 can be detachably coupled with the main portion 104. In at least one example, the main portion 104 can be at least partially made out of plastic to provide structural support to the housing 102. The mesh portion 106 can include the porous membrane 156. The top cover 108 and the bottom gasket 110 can be coupled with opposing sides of the main portion 104 and the mesh portion 106. In at least one example, the top cover 108 and the mesh portion 106 can include the porous membrane 156.

In at least one example, as illustrated in FIG. 3C, the housing 102 can form an aperture 1040 adjacent to the bottom gasket 110. In some examples, the aperture 1040 can permit access to the chamber 120 by a drainage fluid 150. In some examples, the aperture 1040 can permit access to the chamber 120 to allow fluid to flow out of the housing 102. In some examples, the aperture 1040 can permit access to the chamber 120 to permit air to flow out of the housing 102. In some examples, a plug 1042 can be received in the aperture 1040 to block the aperture 1040. Accordingly, fluid cannot pass through the aperture 1040 when the plug 1042 is inserted therein.

The fluid control apparatus 100 (e.g., the housing 102) can configured to accommodate various sizes and spacing of the air vents 30. For example, referring to FIG. 4, the housing 102 is operable to receive two air vents 30. The number of openings 112 in the bottom gasket 110 can correspond with the number of air vents 30 that the housing 30 is operable to receive. The size and shape of the housing 102 is also configured to receive the two air vents 30 in one housing 102 and chamber 120.

Figure 5A:
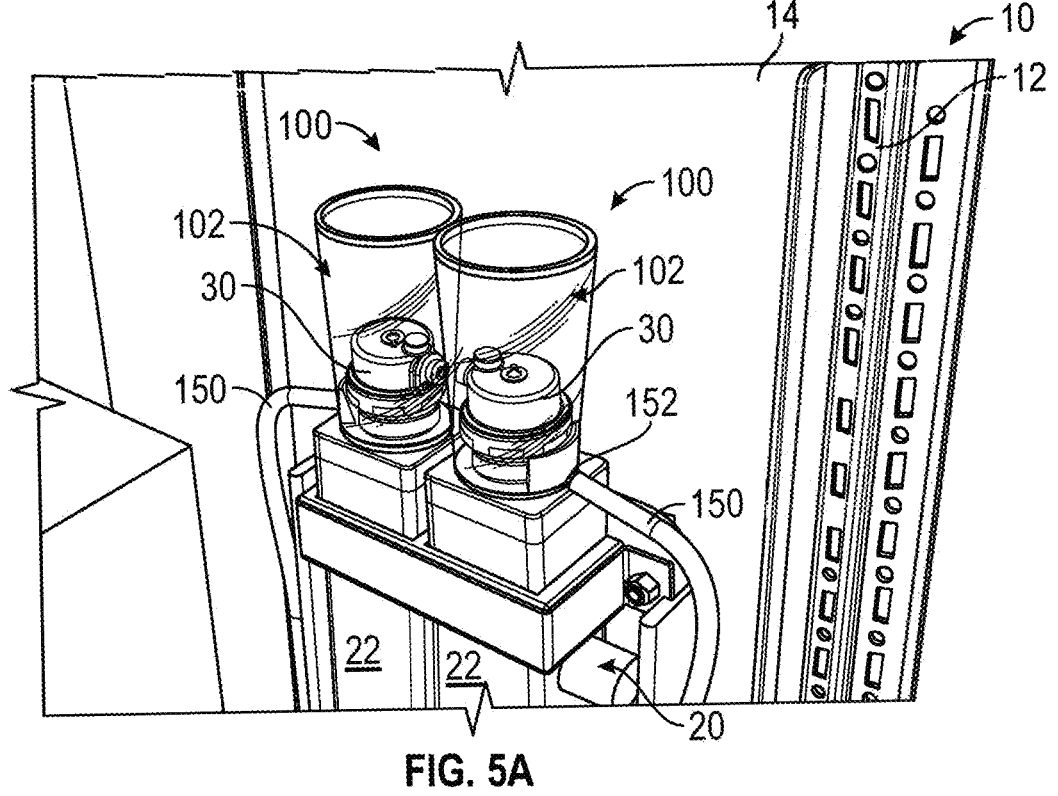
FIG. 5A illustrates another example of the fluid control apparatus on the cooling system.
Figure 5B:
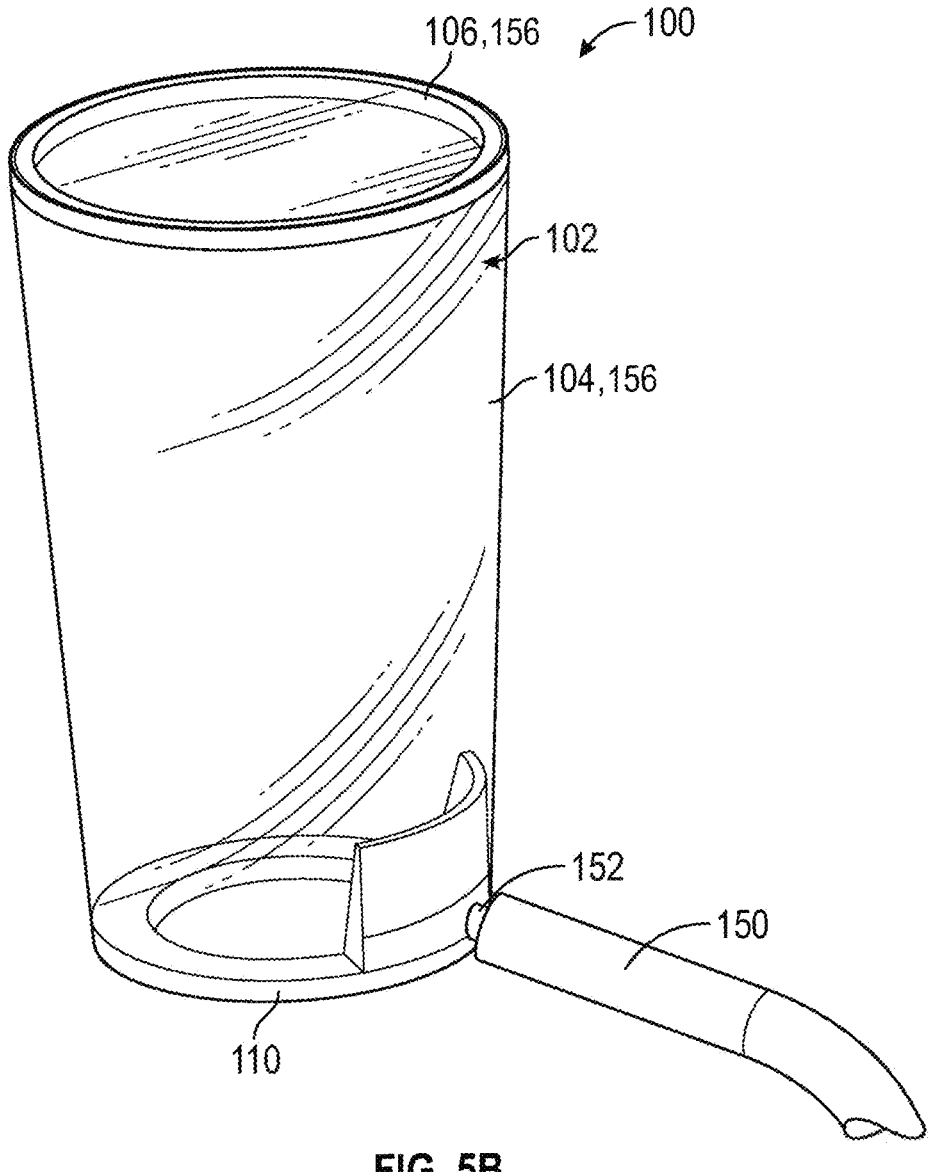
FIG. 5B illustrates the fluid control apparatus of FIG. 5A.

In some examples, as illustrated in FIGS. 5A and 5B, the housing 102 of the fluid control apparatus 100 can be operable to receive only one air vent 30. Accordingly, when the cooling system 20 includes two air vents 30, two housings 102 can be included to each receive one air vent 30.

Similar to the fluid control apparatus 100 in FIGS. 2A-4, the fluid control apparatus 100 as shown in FIGS. 5A-5B can include a housing 102 operable to receive the air vent 30 for the cooling system 20 such that the housing 102 surrounds the air vent 30 and prevents fluid exiting the air vent 30 from passing through the housing 102.

The housing 102 can include a main portion 104, a top cover 108, and a bottom gasket 110. At least a portion of the main portion 104 can include the porous membrane 156 such that air can pass therethrough and prevent fluid from passing therethrough. At least a portion of the top cover 108 can include the porous membrane 156 such that air can pass therethrough and prevent fluid from passing therethrough.

With the bottom gasket 110, the housing 102 can form a localized reservoir to hold excess fluid. The excess fluid can then be removed from the housing 102 via the drainage hose 150 to a desired location such as the drainage tray 200.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A fluid control apparatus comprising:
a housing forming a chamber configured to surround at least one air vent of a cooling system and prevent coolant fluid exiting the air vent from passing through the housing, wherein at least a portion of the housing includes a porous membrane; and
the drainage hose configured to drain coolant fluid from the chamber of the housing.

2. The fluid control apparatus of claim 1, wherein the housing is configured to be attached to the cooling system.

3. The fluid control apparatus of claim 2, wherein the housing includes a bottom gasket configured to allow at least a portion of the at least one air vent to pass therethrough and prevent coolant fluid from leaking therefrom.

4. The fluid control apparatus of claim 3, wherein the bottom gasket is configured to be positioned between the chamber and the cooling system.

5. The fluid control apparatus of claim 1, wherein the porous membrane permits air to pass therethrough and prevents coolant fluid from passing therethrough.

6. The fluid control apparatus of claim 1, wherein the housing forms a seal around the at least one air vent to prevent coolant fluid from passing therethrough.

7. The fluid control apparatus of claim 1,
wherein the housing includes a main portion, a mesh portion, a top cover, and a bottom gasket; and
wherein the main portion is coupled with the mesh portion, and the top cover and the bottom gasket are coupled with opposing sides of the main portion and the mesh portion.

8. The fluid control apparatus of claim 7, wherein the mesh portion and the top cover include a porous membrane.

9. The fluid control apparatus of claim 8, wherein the porous membrane permits air to pass therethrough and prevents coolant fluid from passing therethrough.

10. A rack assembly comprising:
a computing system;
a cooling system configured to provide coolant fluid to the computing system to manage a temperature of the computing system, the cooling system including at least one air vent; and
a fluid control apparatus including:
a housing forming a chamber surrounding the air vent and configured to prevent coolant fluid exiting the air vent from passing through the housing, wherein at least a portion of the housing includes a porous membrane; and
the drainage hose configured to drain coolant fluid from the chamber of the housing.

11. The rack assembly of claim 10, wherein the housing is positioned on the cooling system.

12. The rack assembly of claim 11, wherein the housing includes a bottom gasket sealing the housing to the cooling system.

13. The rack assembly of claim 12, wherein the bottom gasket is disposed between the housing and the cooling system.

14. The rack assembly of claim 10, wherein the porous membrane permits air to pass therethrough and prevents coolant fluid from passing therethrough.

15. The rack assembly of claim 10, wherein the housing forms a seal around the at least one air vent to prevent coolant fluid from passing therethrough.

16. The rack assembly of claim 10,
wherein the housing includes a main portion, a mesh portion, a top cover, and a bottom gasket; and
wherein the main portion is coupled with the mesh portion, and the top cover and the bottom gasket are coupled with opposing sides of the main portion and the mesh portion.

17. The rack assembly of claim 16, wherein the mesh portion and the top cover include a porous membrane.

18. The rack assembly of claim 17, wherein the porous membrane permits air to pass therethrough and prevents coolant fluid from passing therethrough.

* * * * *